(12) United States Patent
Fiedler et al.

(10) Patent No.: US 11,754,511 B2
(45) Date of Patent: Sep. 12, 2023

(54) METHOD AND DEVICE FOR OPTICALLY REPRESENTING ELECTRONIC SEMICONDUCTOR COMPONENTS

(71) Applicant: FormFactor, Inc., Livermore, CA (US)

(72) Inventors: Jens Fiedler, Dresden (DE); Sebastian Gießmann, Dresden (DE)

(73) Assignee: FormFactor, Inc., Livermore, CA (US)

( * ) Notice: Subject to any disclaimer, the term of this patent is extended or adjusted under 35 U.S.C. 154(b) by 434 days.

(21) Appl. No.: 16/195,426

(22) Filed: Nov. 19, 2018

(65) Prior Publication Data

US 2019/0157326 A1 May 23, 2019

(30) Foreign Application Priority Data

Nov. 21, 2017 (DE) .......................... 102017127422.7

(51) Int. Cl.
*H01L 27/14* (2006.01)
*H01L 27/146* (2006.01)
(Continued)

(52) U.S. Cl.
CPC ..... *H01L 27/14601* (2013.01); *G01N 21/956* (2013.01); *G06F 3/0481* (2013.01);
(Continued)

(58) Field of Classification Search
CPC .. A61B 17/02; A61B 1/06; A61B 1/32; A61B 90/30; A61B 2017/0046;
(Continued)

(56) References Cited

U.S. PATENT DOCUMENTS

2004/0121496 A1 6/2004 Brankner et al.
2007/0156379 A1 7/2007 Kulkarni et al.
(Continued)

FOREIGN PATENT DOCUMENTS

WO WO2011/091894 8/2011
WO WO-2011091894 A1 * 8/2011 ........... G01N 21/956

OTHER PUBLICATIONS

English-language translation of WO 2011/091894, Aug. 4, 2011.

*Primary Examiner* — Moin M Rahman
(74) *Attorney, Agent, or Firm* — Kolitch Romano Dascenzo Gates LLC

(57) ABSTRACT

The invention relates to a method for optically representing electronic semiconductor components 2 on structural units 1 as used for contacting semiconductor components, and to a device which can be used for this purpose. The aim of the invention is to improve navigation on the structural unit 1. Regarding the structural unit 1 provided on a holding surface 19 of a holding device 18, a graphical representation 4 of the structural unit 1 or its semiconductor component 2, or of a section thereof, is provided, and a live image 3 of the semiconductor component 2 is displayed on a first display unit 33. A first graphical representation 4 is also displayed on the first display unit 33 in such a way that elements of the first graphical representation 4, referred to as overlays 5, superimpose the live image 3. The first graphical representation 4 is synchronized with the live image 3 in a computer-aided manner such that at least one overlay 5 corresponds to the associated element of the live image 3.

14 Claims, 3 Drawing Sheets

Figure 1:
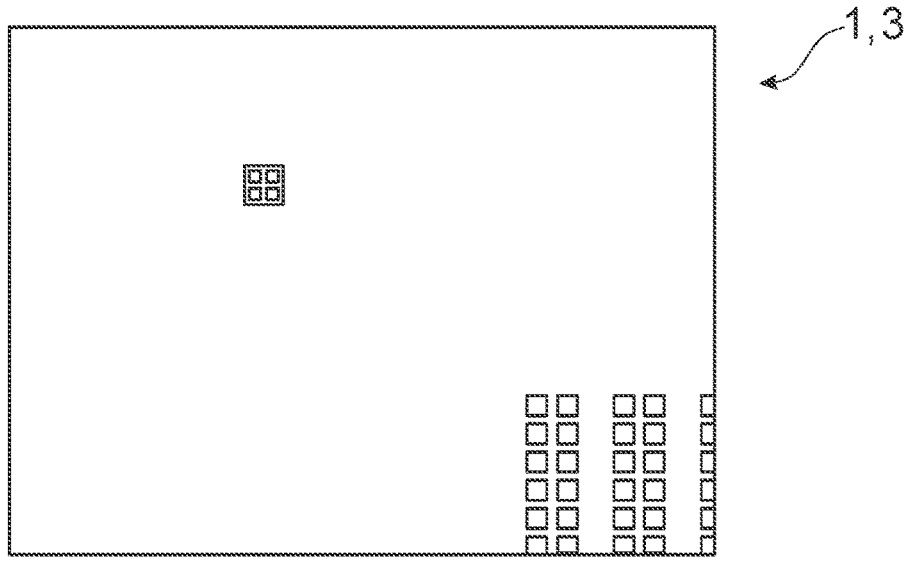

(51) Int. Cl.
  *G01N 21/956* (2006.01)
  *H01L 21/67* (2006.01)
  *G06T 7/00* (2017.01)
  *G06F 3/0481* (2022.01)
  *H01L 25/16* (2023.01)
  *G06V 10/75* (2022.01)

(52) U.S. Cl.
  CPC ........ *G06T 7/001* (2013.01); *H01L 21/67005* (2013.01); *H01L 25/167* (2013.01); *G06V 10/7515* (2022.01); *G09G 2340/12* (2013.01)

(58) Field of Classification Search
  CPC ........... A61B 2017/00473; A61B 2017/00734; A61B 2017/00907; A61B 2090/304; A61B 2090/306; A61B 2090/308; H01L 27/14601; H01L 21/67005; H01L 25/167; G01N 21/956; G06F 3/0481; G06T 7/001; G06V 10/7515; G09G 2340/12
  See application file for complete search history.

(56) References Cited

U.S. PATENT DOCUMENTS

| | | | |
|---|---|---|---|
| 2010/0111403 A1 | 5/2010 | Schineidewind et al. | |
| 2015/0244754 A1* | 8/2015 | Beckham, Jr. | ........ H04L 65/611 709/219 |
| 2016/0045834 A1* | 2/2016 | Burns | ..................... A63H 3/28 446/268 |
| 2018/0035606 A1* | 2/2018 | Burdoucci | ............. A01D 34/84 |

\* cited by examiner

METHOD AND DEVICE FOR OPTICALLY REPRESENTING ELECTRONIC SEMICONDUCTOR COMPONENTS The invention generally relates to a method for optically representing electronic semiconductor components in a defined relative position of a structural unit. The invention also relates to a method for contacting electronic semiconductor components, which method is carried out within the scope of testing methods for establishing the physical and electrical contact of probe tips with contact pads of at least one of the semiconductor components formed on the structural unit and uses the optical representation. The invention further relates to devices for carrying out said methods.

A structural unit is to be understood here as such a unit which comprises a plurality of identical or different semiconductor components. These are, for example, wafers with a multiplicity of identical semiconductor components arranged in a grid, or carrier substrates or circuit arrangements with a plurality of semiconductor components and, if necessary, further circuit structures or other structures which comprise a plurality of semiconductor components.

Such optical representations of semiconductor components are, for example, used for the testing of said semiconductor components, for example for the purposes of function or aging tests, visual inspection, or in other method steps of the production or use of the semiconductor components. Test stations for checking and testing semiconductor components, generally referred to as probers, have suitable hardware and software which provide a view of the semiconductor component in order to observe structures and contact surfaces of the semiconductor component and/or probe tips, and their alignment relative to the contact surfaces.

Probers further comprise a holding device for receiving and holding the structural unit, what is known as a chuck, which has a surface for receiving dies to be tested, also referred to herein as a holding surface, and can regularly be moved in the X and Y direction of the 3-dimensional Cartesian coordinate system. The prober furthermore comprises a probe holder for the probe tips, also called probes, the number and position of which correlate with the contact surfaces of the semiconductor component, also referred to as test substrate, die, or DUT (device under test), to be contacted simultaneously using a contacting process. The probe holders may also be movable in the X and Y direction relative to the semiconductor component, in order to position the ends of the probe tips.

In order to establish the physical and electrical contact, a relative movement in the Z direction between the probe tips and the semiconductor component is required in addition to the movement capability of the semiconductor component and/or probe tips in the X/Y plane, which is frequently defined as the plane in which the holding surface of the chuck lies.

The required adjusting movements in the Z direction can usually be realized by the chuck in conjunction with a positioning device of the probe holder. If a plurality of contact surfaces is contacted simultaneously by a probe tip arrangement, the precise angular alignment of the arrangement of the probes with the contact surfaces is also required in addition to the precise alignment of the semiconductor component and probe tips in the X and Y directions.

The correct X/Y relative position, and sometimes also the correct Z feed between the probe tips and contact surfaces, are observed by means of optical display devices.

For testing a semiconductor component, its contact pads and the probe tips are aligned in their X and Y positions so that they are opposite each other. From this position, the adjusting movement takes place in the Z direction in order to establish reliable physical and electrical contact so that the corresponding test signals can be fed in and/or tapped by means of suitable testing devices. After testing of a semiconductor component is completed, the contact of the probe tips may be disconnected so that the position of a further semiconductor component may be approached and the latter may be contacted for testing. The position of a test substrate relative to the geometry and design of the structural unit comprising the test substrate can be determined via the reference planes and reference points of the chuck, or via suitable sensors.

Used in the various applications for the optical representation of the semiconductor component are microscopes and/or cameras, hereinafter also generally referred to as imaging units, which represent the surfaces to be contacted in high resolution as a live image (FIG. 1) and, in doing so, view the contact position from above and/or laterally. Due to the high integration density and the associated very small structures to be represented, which can be in the micrometer and nanometer range, the high magnifications required for this purpose do not allow clear identification of the magnified region and its real position on the structural unit based solely on the visible details.

A supplementary graphical representation (FIG. 2) of the entire structural unit or of such a section thereof, which section can be clearly identified on the basis of its representation, is therefore often provided so that detection of the current position of the probe tips and a navigation on the structural unit in the course of the positioning movement are possible. Such a graphical representation contains various graphic features or classification features which are suitable for identifying and/or characterizing a semiconductor component. These may be, for example, the dimensions and boundaries of each individual semiconductor component, its coordinates, its test status, or other distinctive classification features.

By comparing the real representation with the graphical representation, the position of a currently shown real representation may be determined in the graphical representation. In the course of the contacting method, the operator switches between the real representation and the graphical representation in order to navigate and check whether the correct semiconductor component or its correct section is actually represented. Switching between the representations is often perceived by the operator as disruptive, and may also be the cause of errors in the correct position assignment and of an increased time expenditure in the test. The usable position markers are moreover limited to the markers known from the design of the structural unit, which may also be repeated and are therefore not suitable in every instance.

Starting from the prior art described above, the invention deals with the object of providing a method for optically representing a structural unit and the electronic semiconductor components formed thereon, in particular for their contacting methods, and devices designed for this purpose, in which switching between different representations is avoided.

Furthermore, suitable markers for position determination are also to be provided for navigation on the structural unit after a displacement of the structural unit relative to the imaging unit.

It should also be possible to use real markers regarded as suitable by the operator for determining the position of the real representation.

The object of the invention in terms of the method is achieved by the subject matter of claim 1, the focus of which is that at least one graphical representation, which is electronically stored, is provided for a structural unit which comprises at least one semiconductor component formed on its front side and is arranged on a holding surface of a holding device.

A graphical representation shall hereafter be understood to be an image which relates to the structural unit itself or a section thereof, or to the semiconductor component formed on the structural unit and to be represented optically or a section thereof, or to a combination of a plurality of the elements mentioned, and which reflects characteristic, geometric and/or structural markers suitable for navigation on the structural unit. A graphical representation may additionally or alternatively also represent further geometric features suitable for optical representation, navigation, and/or precise zooming. Such geometric features are, for example, the boundaries of the holding surface and/or suitable reference points of the structural unit, of the semiconductor component, and/or of the holding device. The graphical representation may originally also be empty except for such an element or such information needed to perform the subsequently described synchronization of the graphical representation with the live image. These may be the boundaries of the structural unit or of a semiconductor component, or one or more reference points or the like. Such an "empty" graphical representation may be supplemented by the operator with further elements, such as information and graphical features as described in more detail below.

The front side of the structural unit refers here to that surface of the structural unit on which a semiconductor component to be visualized is formed.

Furthermore, an image of the semiconductor component or a section thereof is recorded by means of an imaging unit which comprises at least one image sensor for this purpose, and said image is displayed on a first display unit. This image is subsequently referred to as a live image in order to distinguish it from further images combined therewith. It is obvious that the live image is recorded with such a resolution, and that the display unit is suitable, so that the structure sizes of interest, such as contact surfaces, conductor traces, or other details of the semiconductor component or of the structural unit, can be represented with the required resolution.

Furthermore, a first graphical representation from the above-described variants is also displayed on the first display unit, i.e. is displayed together with the live image, such that elements of the first graphical representation superimpose the live image. The superposition is effected such that essential image contents of both representations are visible at the same time. For this purpose, those image contents that are not required and interfere with the representation are hidden computationally. Such a partial representation of the live image or of the graphical representation can, for example, be carried out such that their contents are associated with different layers which can be individually selected, processed, and displayed. For example, with respect to FIG. 2 it would be useful to associate the boundaries, visible as continuous lines, of the individual semiconductor components of the wafer with a first layer, the designations of the semiconductor components with a second layer, and the wafer with its boundary and the holding surface with a third layer. The first and the second layer could be used for superimposing the live image so that their contents are represented as superimposed elements in front of the background of a live image. A superimposed element of a graphical representation is referred to hereinafter as overlay.

Elements of the graphical representation that are usable as an overlay may be all of those components of the graphical representation that are suitable for navigation and orientation on the structural unit and identification and/or characterization of a semiconductor component and its components. The person skilled in the art knows numerous elements of the graphical representations suitable for this purpose, and is able to identify others as suitable. For example, boundaries, coordinates, and test information of the semiconductor components, details of the semiconductor components and their definition or identification, boundary lines that should not be exceeded during movements of the structural unit, and other suitable position-related information can be used. These may be arranged in a functionally reasonable manner on one or more layers of a graphical representation, and therefore can be displayed or hidden purposefully.

If a detail of the structural unit is of particular interest, a snapshot which images both the live detail and overlays associated therewith may be generated using the recording unit.

In order to identify the corresponding real details (element) of the live image by means of the overlays, computer-aided synchronization of the first graphical representation with the live image takes place in a further method step. For example, synchronization takes place by means of the position references of the holding device and/or of the structural unit, such as coordinates of a reference plane or reference points which can be transferred to the imaging unit, and therefore also to the live image. These have equivalents in the graphical representation, or allow a clear reference thereto to be established, so that a clear local and angular association between two representations is thereby to be produced.

The selection of positions that are suitable for synchronization, and the synchronization itself, may take place in a computer-aided manner, or visually, or by a combination of the two. In a visual synchronization, a structure which is to be identified clearly, and which is present actually and as an overlay, are positioned relative to one another [sic] under observation, and the two positions are noted as corresponding. For example, the user may move a corner of a semiconductor component precisely below the center of the image of the observing camera. This corner point can be clearly located both in the live image and in the graphical representation.

The computer-aided determination, association, and linking of the position references and their equivalents may take place by means of a computer that is appropriately conditioned on the software side, which computer serves to control the holding device and the imaging unit, and in which the graphical representations are stored. Via the computer control, access is provided to the positions of the holding device and/or the structural unit, their reference planes or reference points, and their current coordinates and their coordinates to be approached.

The essential concept of the invention is also to be described in that the graphical representations are correctly linked to the view of the imaging unit onto the structural unit, and to the position of the holding surface, so that the adaptable graphical representation becomes part of the real representation. It is thus possible that the visible detail can be identified immediately if there is a change of the zoom and of the displayed section of the live representation. Such a locally identifiable and additional information-containing optical representation of even highly magnified excerpts of a structural unit is required in many fields of microelectronics, where the increasing scaling places ever higher demands on the optical representation.

In one embodiment of the method, the linking, i.e. synchronization of the graphical representation with the live image, may take place such that such a synchronized graphical representation follows a displacement of the structural unit relative to the imaging unit. Such a relative displacement results in a change in the section of the structural unit displayed in the live image, or in a change in the position of the structural unit in the live image. As a result of such a synchronization, each change in the live image that is caused by the relative movement is immediately reflected in the corresponding change in the displayed graphical representation so that, in the visible section of the structural unit, the graphical representation corresponds to the live image after the relative movement, and the overlays are updated in any new representation so that the overlays that belong to the visible section of the structural unit are then shown.

Since the method described here is suitable in particular for navigation or orientation in a section of the structural unit that is displayed at high magnification, it is to be described below with reference to this application. In an analogous manner, the method may also be applied to a complete representation of a structural unit.

The relative movement between structural unit and imaging unit is regularly carried out by means of suitable positioning devices that move either the holding surface or the imaging unit, or both, along movement paths that can be traversed precisely and usually also in an automated manner on the basis of the aforementioned position references or on the basis of the control of the movement devices. The stored graphical representation may be virtually tracked on these movement paths by means of a computer control unit. Alternatively or additionally, the movement sequence or the new image section of the live image may be computationally determined from the live image itself, and the graphical representation may be adapted thereto. Other possibilities supported by the device used may also be utilized to track the graphical representation on the live image.

The optical representation of semiconductor components may be carried out for various purposes, for example for optical inspection of the structural unit, for positioning of contact probes on selected contact surfaces of the semiconductor component, or for other purposes. In the event of positioning of contact probes, which have very small probe tips in the dimensions considered here, the live image may show at least one of the probe tips in addition to the semiconductor component if the probe tips are at least roughly aligned with the contact surfaces. Alternatively or additionally, a graphical representation can also show the probe tips or marks identifiable as such as overlays. Additional information regarding the probe tips may also be displayed in their graphical representation, such as a numbering, a position identification, an overlay generated by the operator, or a different overlay, wherein the above-described variations of their arrangement in graphical representations and their layers may be applied here as well.

Often, an operator who performs an optical representation of a section of a structural unit detects particular features on the structural unit which would in principle be usable for orientation. These may be flaws or deviations in the structural unit and/or in the semiconductor components, boundaries of components, reference marks, or other locally differentiable characteristics. In order to be able to use these for navigation and orientation, in an additional embodiment of the method the operator adds one or more overlays in one or more suitable graphical representation stored for the structural unit. By adding the application-specific generated overlays in a graphical representation, optionally on separate layers, these overlays are also synchronized with the live image and may be found again.

Such overlays may be graphic marks such as circles, reticles, rectangles, lines, or others. They may also contain text for describing the marked property of the structural unit. Color differences of the overlays to organize them, or color markings of only details of the live image, are also possible. The generation of such application-specific overlays is carried out by means of a suitable input device such as a keyboard, mouse, input pens usable on touch-screens or graphical tablets, or other such devices.

If the structural unit comprises a plurality of repeating details, such as a multiplicity of identical semiconductor components of a wafer, one or more overlays associated with such a detail and represented in a section of the structural unit may be recorded in an overlay image, and the overlay image may be used as a further graphical representation for further similar sections of the structural unit. In the optical representation of semiconductor components at the wafer level, a plurality of semiconductor components or sections thereof, such as individual contact surfaces, may thus be represented sequentially, and one of the graphical representations associated with the first semiconductor component may be used for at least one additional semiconductor component.

Such overlay images reduce the effort for generating the graphical representations required for a structural unit, and the scope of graphical representations. [They] are also useful for orientation within a detail of interest or a plurality of details similar thereto, at correspondingly high magnification of the live image.

For navigation on the structural unit, according to a further embodiment of the method it may also be helpful if at least one of the further graphical representations is displayed on the first display unit or a second display unit. Whether one of the further graphical representations that [contains] further information added by the operator or characterizing external components, in addition to the standardized information available regarding the structural unit, are [sic] displayed on the first or a further display unit depends on the information content of the further graphical representation. The representation on one and the same display unit comes into consideration if, for example, the further graphical representation shows supplementary information regarding the individual components and thus enhances the optical representation. Representation on separate display units is helpful if different tasks should be implemented with the two display units, e.g., an enlarged representation on the first and a representation of the complete structural unit or a larger section of the structural unit on the second display unit.

One application of the previously described method for optical representation are methods for contacting a semiconductor component formed on the front side of a structural unit by means of probe tips, wherein the latter may serve both to locate the contact surfaces to be contacted as described above and to position the probe tips relative to the contact surface and to establish the physical and electrical contact. For positioning and establishment of the contact, representation of at least one probe tip in the live image and/or in a graphical representation is obviously required.

The contacting method comprises the following basic method steps:

First, the optical representation of a semiconductor component of a structural unit which should be contacted, or a section thereof, is carried out using the above-described method, wherein the display should include at least those contact surfaces on which the contact tips are to be placed.

At the same time or thereafter, the probe tips are added to the optical representation in the live image or a further graphical representation according to the above description so that the alignment of the position of the contact surfaces of the semiconductor component and of the probe tips relative to one another may then take place on the basis of the representation of the probe tips. This is done in such a way that the required movements of probe tips and/or contact surfaces relative to one another are carried out while observing by means of the method for optical representation, until the contact surfaces and probe tips are opposite each other at a distance. Then, the final adjusting movement between the semiconductor component and probe tips may take place until a physical and electrical contact is established. The person skilled in the art would add known method steps to the extent that it is reasonable or necessary.

Using the contacting methods, the semiconductor component to be contacted and/or individual contact surfaces may be represented on a display, together with the probe tips or graphical indications thereof. This representation may be supplemented by graphical representations with their overlays to complete the information about the semiconductor component to be contacted, and optionally also the probe tips. This is of particular interest if only a few of a plurality of contact surfaces are displayed.

Figure 2:
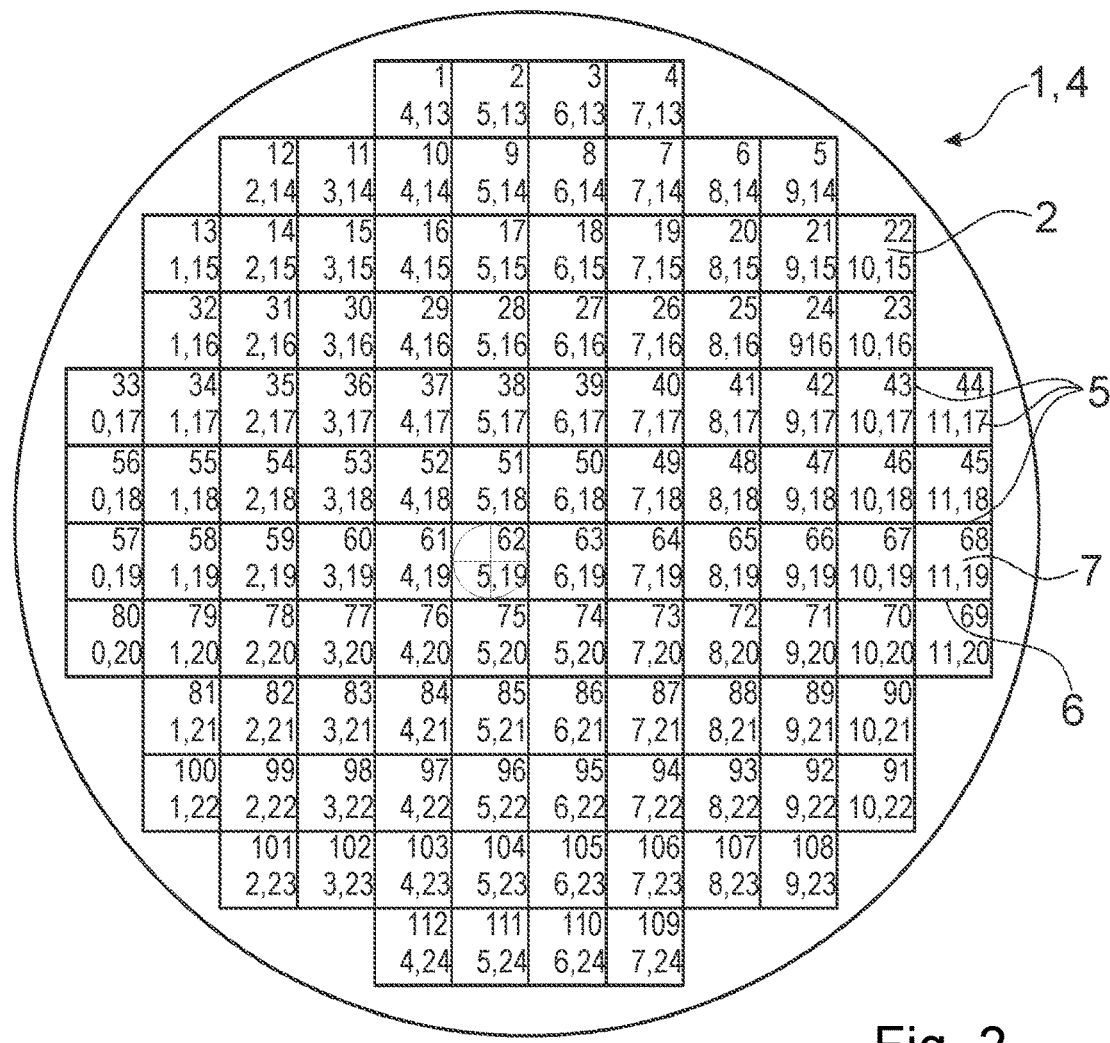

A suitable graphical representation is, for example, a wafer map (FIG. 2). This map usually shows the pattern of the semiconductor components arranged on the wafer as elements of the graphical representation, and numbers their positions according to a predefined rule. Furthermore, the X/Y coordinates of each semiconductor component, its number, size, boundaries, and orientation, as well as the shape and size of the structural unit, can be learned therefrom. For the purposes of testing, the semiconductor component currently in testing, the first semiconductor component to be tested, and the reference component may also be identified.

Beyond this basic information, the classification of the semiconductor components according to the results of previous measurements (binning information) as well as the number, position, size, and binning information of substructures of the semiconductor component and other information, may also be of interest for the orientation and for the tests of the structural unit. Said other information regards the structural unit, so that it may also be included in a graphical representation.

If the desired graphical representation is configured, it may be correspondingly displayed in the representation of the live image of the structural unit so that the semiconductor component precisely corresponds to the real semiconductor component in terms of X/Y angles and in terms of the surface. The representation produced in this way shows all information of the wafer map, such as coordinates and component boundaries, in addition to the live image. In addition, the operator may input user-specific overlays.

Each overlay that is available from the wafer map and/or possibly from other graphical representations and/or from the further graphical representation with application-specific generated overlays is linked to a position of the holding surface, and thus to the structural unit arranged thereon, as a result of the synchronization of live image and graphical representation, so that during a movement of the holding surface the overlays may be recalculated continuously according to the position changes and be displayed in the changed representation. This is done computationally using the respective current position information of the holding device. Since a live image change would also similarly result by moving the imaging unit, insofar as the latter is designed to be movable, in this instance the position information and the position changes are also used in an analogous manner alternatively or additionally by the movement device of the imaging unit to track the graphical representation.

In terms of the device, the object of the invention is achieved by the subject matter of claim 8, wherein the focus is on the device comprising the following basic components:
- a holding device having a holding surface for receiving a structural unit,
- an imaging unit for observing and recording live images of a semiconductor component,
- a movement device which moves the holding device and/or the imaging unit relative to one another in at least one plane which is parallel to the holding surface,
- a storage unit for storing live images and graphical representations,
- at least one display unit for displaying live images and/or graphical representations, and
- a computer control unit that is designed to control the imaging unit, the movement device, the storage unit, and the display unit.

The software of the computer control unit is designed such that it may perform a computational synchronization of at least one stored graphical representation with a live image based on the position information of the holding device relative to the holding surface and of the imaging unit, and consequently relative to the image, so that an element of the graphical representation corresponds to an element of the live image.

Such a corresponding image may be continuously updated as a result of the synchronization and using current position information which may be obtained from the control of the movement device, according to the above description of the method to be performed with the device.

The storage unit of the computer control unit may also serve to store the images, the graphical representations, and overlays. Alternatively, these may also be stored in an external storage unit, e.g. of a network.

A suitable computer control unit regularly also comprises the further required operating elements, such as keyboard, mouse, graphical input aids, etc., which serve for operation of the control unit and also for inputting and generation of information which can be used for generating user-specific overlays. This information may be elements of the structural unit, of the semiconductor component, of the live image, or of a graphical representation. Information obtained from reasonable combinations of these elements may also be used to generate overlays.

Insofar as the above device is configured for contacting the semiconductor components of the structural unit, it comprises additional probe tips for physically and electrically contacting the semiconductor component. In addition, the movement device is designed in such a way that the probe tips and/or the holding surface may be adjusted relative to one another in order to establish the contact, wherein the adjustment comprises the necessary positioning steps. As a result, as is generally known of probers the probe tips and/or the holding device can be moved in the X, Y, and/or Z direction, and/or be aligned at an angle to one another.

The invention is to be described in more detail below by way of example, based on exemplary embodiments, but not in a limiting manner. The person skilled in the art would purposefully combine the features previously and subsequently realized in various embodiments of the invention into further embodiments, and also use them analogously for other applications to the extent required and allowed by the respective requirements for the method.

The drawings belonging to the exemplary embodiments show in

Figure 3:
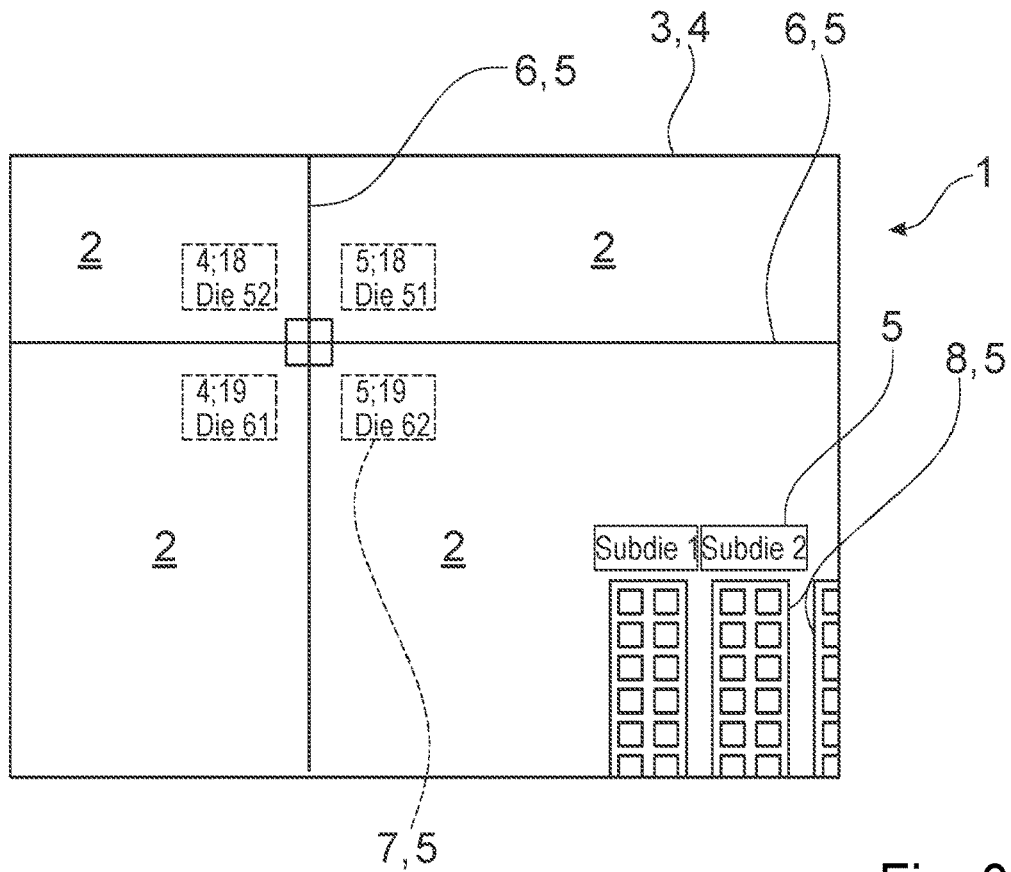
Figure 4:
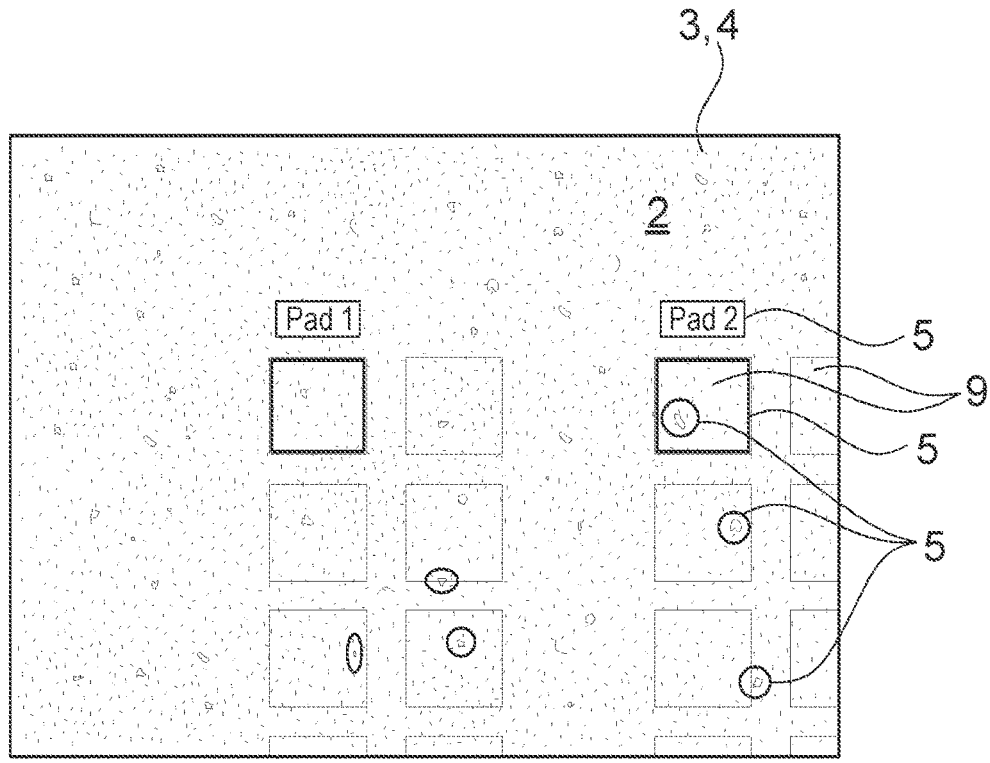
Figure 5:
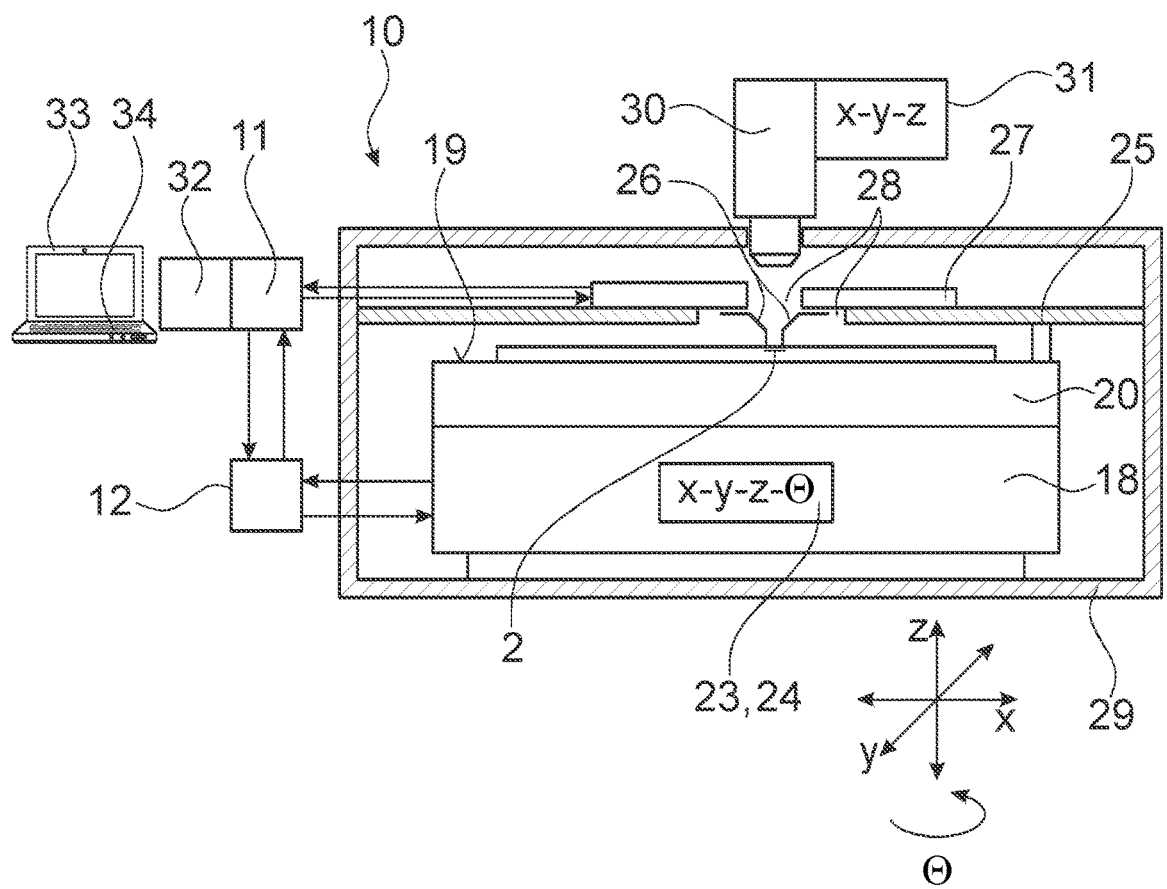

FIG. 1 a live image of a section of a wafer;

FIG. 2 a wafer map;

FIG. 3 the wafer section of FIG. 1, superimposed with a graphical representation;

FIG. 4 a wafer section as a live image, superimposed with a further graphical representation; and FIG. 5 a prober with which the methods according to the invention can be carried out.

FIG. 1 shows a real section of a structural unit 1, in the present instance a wafer 1, as live image 3. Structures whose association cannot be learned from the image can be seen.

FIG. 2 shows a wafer map as a graphical representation 4 of a wafer 1. The individual, square, and optionally similar semiconductor components 2 whose semiconductor component identification 7 contains the number of the semiconductor component and its position in the row and column can be seen. Based on this information, each semiconductor component 2 can be clearly identified, and the position can be determined because the size of the semiconductor components 2 is known. The wafer map, like all further images, graphical representations 4, and overlays 5 described below, is stored in the storage unit (not shown).

FIG. 3 shows the wafer section according to FIG. 1, whose live image 3 is superimposed with a graphical representation 4. The graphical representation 4 is formed by a plurality of overlays 5. In the present case, these are the semiconductor component boundaries 6, the semiconductor component identifications 7, as well as the designations and boundaries of the contact surface rows 8. Based on this information, the semiconductor component 2 whose contact surface rows 8 are shown can clearly be identified as semiconductor component ("die") no. 62. The position of the appertaining semiconductor component 2 is clear in FIG. 2, whose image can optionally simultaneously be shown with the image of FIG. 3 in picture-in-picture form on one display (not shown). The overlays 5 shown in FIG. 3, which relate to the semiconductor component 2, are part of the wafer map. The overlays 5 which characterize the contact surface rows 8, learned from a graphical representation, mark the elements of the semiconductor component 2 and may also be applied to the other, similar semiconductor components 2 of the wafer 1. This can be realized by associating these overlays 5 with their own graphical representation 4, or with a layer (not shown) of the graphical representation 4 of the wafer map.

FIG. 4 shows an enlarged illustration of the contact surface rows 8 of FIG. 3. Their live image 3 also comprises overlays 5 of a further graphical representation 4. These overlays 5 mark number and size of the contact surfaces ("pads") 1 and 2 and can also be applied to similar semiconductor components 2 of the wafer 1.

In addition, special structural features of the contact surfaces 9 are marked here by elliptical overlays 5 so that, on the basis of these stored overlays 5, the contact surfaces 9 can also be clearly identified and associated with a semiconductor component 2.

Without any claim to completeness, FIG. 5 schematically shows a prober 10 which is designed to carry out the inventive method.

The prober 10 comprises a holding device 18, also referred to as a chuck, with a holding surface 19 for receiving structural units 21. In the exemplary embodiment shown, the holding surface 19 is the upper surface of a support plate 20 that can be removed from the chuck 18.

The prober 10 further comprises a probe holder 25 arranged opposite the holding surface 19. The probe holder 25 holds a plurality of probe tips 26 which are arranged relative to one another in such a way that they correspond to the arrangement of the contact surfaces (not shown in more detail) of the semiconductor component 2 of the structural unit 21 that are to be contacted simultaneously. The probe tips 26 in their defined position relative to one another are generally referred to as a probe arrangement 26. In the exemplary embodiment shown, the probe arrangement 26 is fixedly mounted on what is known as a probe card 27.

A probe card 27 is usually a printed circuit board on which the needle-shaped probe tips 26 are precisely aligned and fixed, and on which the leads to the individual probe tips 26 are also designed as conductor traces. Alternatively, separate probe tips 26 may also be mounted on the probe holder 25. Separate probe tips 26 can often also be aligned to each other directly on the probe holder 25 by means of suitable manipulators (not shown). Separate probe tips 26 of this type are usually used for individual measurements for which the production of a probe card 27 is too expensive.

In order to move and position the structural unit 21 and the probe arrangement 26 relative to one another, the prober 10 further comprises a movement unit 23. The latter can be constructed in very different ways depending on which components should be moved. A movement unit 23 typically comprises a drive 24 for the chuck 18 so that said chuck 18 can be moved in the X, Y, and usually also in the Z direction. For an angular alignment, the chuck 18 can regularly be rotated by an angle $\Theta$. The position of the X, Y, and Z directions, as well as the angle $\Theta$, can be learned from the pictogram in FIG. 5 and corresponds to the typical alignment. The drive 24 of the chuck 18 may be operated manually or motorized; for automated movement sequences, a motorized drive 24 is arranged which is controlled by a machine controller 12 which converts the control signals into power signals. Alternatively, the machine controller 12 may also be part of the process controller 3.

In addition to the movement capability of the structural unit 21 in the X/Y plane, which is usually defined as the plane in which the holding surface 19 of the chuck 18 lies, a relative movement in the Z direction between the probe arrangement 26 and the structural unit 21 is required in order to establish the electrical contact of the probe arrangement 26 on the structural unit 21. In the exemplary embodiment, the required movements in the Z direction with a probe card 27 are carried out solely by the chuck 18. Alternatively, a combination of the chuck movement with a movement of the probe arrangement 26 in the Z direction is also possible for the final probe adjustment. In this instance, the probes also comprise manually operated or motor-operated manipulators, e.g., cross tables, which are driven with micrometer screws. All cited components for the movement of structural unit 21 and probes 26 relative to one another for the purpose of positioning and contacting are associated with the movement unit 23.

For observing the movement and the positioning, and possibly also for contacting, the prober 10 comprises an imaging unit 30 which can be moved in the X, Y, and Z direction by means of its own controller 31, communicating with the central computer control unit 11, in order to make the desired section of the structural unit 1, e.g., the contacting region, visible at the required resolution. Alternatively, the imaging unit 30 may also be moved by means of the computer control unit 11. The structural unit 1 is observed through corresponding central openings 28 in the probe holder 25 and in the probe card 27, as well as in the housing 29 which surrounds the described components.

The central computer control unit 11 of the prober also in particular realizes, by means of suitable hardware and software, the optical representation of a desired section of the structural unit 1 in the live image 3, as well as of a stored graphical representation or a plurality thereof, as well as their synchronization as described above. Those sequences of the above-described methods for optically representing and contacting semiconductor components 2 which relate to the movement of the support surface 19 and/or of the imaging unit 30, the operation of the imaging unit 30 and of the display unit 33, and possibly the operation of the probe arrangement 26 and of its signal transmission and signal processing, may moreover be controlled by means of the computer control unit 11. The control of the testing sequence to be performed using the prober 10 may also be realized by means of the computer control unit 11.

All data required for navigation on the structural unit 1 and optical representation of its semiconductor components 2 according to the method described above and the testing sequences are stored in a retrievable manner in a storage unit 32 which is regularly associated with the computer control unit 11, in particular data of the structural unit 1 and of the semiconductor component 2, live images 3 and graphical representations, data for controlling the test signals, and data for positioning and contacting, and other data.

REFERENCE SYMBOL LIST

1 Structural unit, wafer
2 Semiconductor component
3 Live image
4 Graphical representation
5 Overlay
6 Semiconductor component boundary
7 Semiconductor component identification
8 Contact surface rows
9 Contact surface
10 Prober
11 Computer control unit
12 Machine control
18 Holding device, chuck
19 Holding surface
20 Support plate
23 Movement device
24 Drive
25 Probe holder
26 Probe arrangement, probe tips
27 Probe card
28 Central openings
29 Housing
30 Imaging unit
31 Controller of the imaging unit
32 Storage unit
33 Display unit
34 Input device

The invention claimed is:

1. A device for optically representing an electronic semiconductor component with a display unit, the device comprising:
 a holding device having a holding surface configured to receive a structural unit that includes the electronic semiconductor component;
 an imaging unit configured to record a live image of the electronic semiconductor component;
 a movement device configured to move the holding device and the imaging unit relative to one another in at least one plane that is at least substantially parallel to the holding surface;
 a storage unit configured to store the live image and an electronically stored graphical representation of at least a region of the structural unit;
 a display unit configured to display at last one of the live image and the electronically stored graphical representation; and
 a computer control unit programmed to control the imaging unit, the movement device, the storage unit, and the display unit by:
  positioning the structural unit, which includes the electronic semiconductor component, on the holding surface of the holding device;
  providing the electronically stored graphical representation of at least a region of the structural unit;
  displaying, on the display unit as the live image, an optical image of at least a region of the electronic semiconductor component;
  displaying the electronically stored graphical representation on the display unit such that elements of the electronically stored graphical representation superimpose the live image to define an overlay; and
  electronically synchronizing the electronically stored graphical representation with the live image such that the overlay corresponds to superposition of an element of the live image with a corresponding element of the electronically stored graphical representation.

2. The device of claim 1, wherein the computer control unit further is programmed to control the movement device by displacing the structural unit relative to the imaging unit, and further wherein the electronically synchronizing includes maintaining the superposition of the element of the live image with the corresponding element of the electronically stored graphical representation during the displacing.

3. The device of claim 1, wherein at least one of:
 (i) the live image includes an image of at least one probe tip configured to contact the electronic semiconductor component; and
 (ii) the electronically stored graphical representation depicts at least one probe tip configured to contact the electronic semiconductor component.

4. The device of claim 1, wherein the computer control unit further is programmed to receive, from an operator, an operator-supplemented graphical representation and to supplement the electronically stored graphical representation with the operator-supplemented graphical representation.

5. The device of claim 1, wherein the computer control unit further is programmed to control the operation of the imaging device by recording the optical image with the imaging unit.

6. The device of claim 5, wherein the computer control unit further is programmed to control the imaging unit, the movement device, the storage unit, and the display unit by:

electronically storing the overlay as an electronically stored overlay image; and repeating the positioning, the providing, the recording the optical image, the displaying the optical image, the displaying the electronically stored graphical representation, and the electronically synchronizing utilizing the electronically stored overlay image as the electronically stored graphical representation.

7. The device of claim 6, wherein, prior to the repeating, the recording the optical image includes recording a first optical image of a first region of the electronic semiconductor component, and further wherein, during the repeating, the recording the optical image includes recording a second optical image of a second region of the electronic semiconductor component that differs from the first region of the electronic semiconductor component.

8. The device of claim 1, wherein the computer control unit further is programmed to utilize the overlay to contact at least one probe tip with the electronic semiconductor component.

9. The device of claim 8, wherein, subsequent to contact between the at least one probe tip with the electronic semiconductor component, the computer control unit further is programmed to electronically test the electronic semiconductor component via the at least one probe tip.

10. The device of claim 1, wherein the region of the structural unit includes at least one of:
  (i) an entirety of a side of the structural unit;
  (ii) a portion of the structural unit;
  (iii) the electronic semiconductor component;
  (iv) a portion of the electronic semiconductor component;
  (v) a boundary of the holding surface;
  (vi) at least one reference point of the structural unit;
  (vii) at least one reference point of the electronic semiconductor component; and
  (viii) at least one reference point of the holding device.

11. The device of claim 1, wherein the computer control unit further is programmed to control the imaging unit, the movement device, the storage unit, and the display unit by:
  at least one of:
  (i) displaying an image of a probe tip on the display unit; and
  (ii) displaying an electronically stored graphical representation of the probe tip on the display unit;
  aligning a contact surface of the electronic semiconductor component and the probe tip relative to one another, utilizing the overlay, such that the contact surface and the probe tip are opposite each other at a distance while displaying the relative movement of at least one of the probe tip and the contact surface with the display unit; and
  executing an adjusting movement between the electronic semiconductor component and the probe tip until physical and electrical contact are established between the electronic semiconductor component and the probe tip.

12. The device of claim 11, wherein, subsequent to the executing, the computer control unit further is programmed to electrically test the electronic semiconductor component via the probe tip.

13. The device of claim 1, wherein the corresponding element of the electronically stored graphical representation has a shape that corresponds to a shape of the element of the live image.

14. The device of claim 13, wherein the electronically stored graphical representation further includes a label that identifies the element of the live image.

* * * * *